(12) United States Patent
Osawa (10) Patent No.: US 11,474,220 B2
(45) Date of Patent: Oct. 18, 2022

(54) ULTRASONIC DEVICE AND ULTRASONIC MEASURING APPARATUS

(71) Applicant: Seiko Epson Corporation, Tokyo (JP)

(72) Inventor: Eiji Osawa, Chino (JP)

(73) Assignee: SEIKO EPSON CORPORATION

( * ) Notice: Subject to any disclaimer, the term of this patent is extended or adjusted under 35 U.S.C. 154(b) by 277 days.

(21) Appl. No.: 16/170,515

(22) Filed: Oct. 25, 2018

(65) Prior Publication Data

US 2019/0129018 A1     May 2, 2019

(30) Foreign Application Priority Data

Oct. 26, 2017    (JP) .............................. JP2017-207577

(51) Int. Cl.
     *G01S 7/521*      (2006.01)
     *B06B 1/06*      (2006.01)
     *H01L 41/113*      (2006.01)

(52) U.S. Cl.
     CPC ............ *G01S 7/521* (2013.01); *B06B 1/0622* (2013.01); *H01L 41/1132* (2013.01)

(58) Field of Classification Search
CPC .... G01S 7/521; B06B 1/0622; H01L 41/1132
See application file for complete search history.

(56) References Cited

U.S. PATENT DOCUMENTS

| | | | | |
|---|---|---|---|---|
| 4,327,427 A | * | 4/1982 | Hotta | ...................... B64C 25/42 |
| | | | | 367/118 |
| 9,647,196 B2 | * | 5/2017 | Bauer | ...................... H01L 24/11 |
| 2010/0202253 A1 | | 8/2010 | Nakamura | |
| 2013/0235537 A1 | * | 9/2013 | Swett | ................... H05K 5/0213 |
| | | | | 361/752 |
| 2013/0263669 A1 | * | 10/2013 | Nakanishi | ................ G01H 9/00 |
| | | | | 73/655 |
| 2014/0018661 A1 | * | 1/2014 | Tsujita | .................. A61B 5/0095 |
| | | | | 600/407 |
| 2014/0276087 A1 | | 9/2014 | Corl | |
| 2015/0094590 A1 | | 4/2015 | Kiyose et al. | |
| 2016/0120513 A1 | * | 5/2016 | Aragaki | .............. G01S 15/8963 |
| | | | | 600/443 |
| 2017/0257076 A1 | * | 9/2017 | Kaneko | ................... H03H 9/174 |

FOREIGN PATENT DOCUMENTS

| | | | | |
|---|---|---|---|---|
| CN | 104236379 A | * | 12/2014 | |
| CN | 104510497 A | | 4/2015 | |
| EP | 0800920 A2 | * | 10/1997 | ............. B41J 2/161 |
| JP | H10-224895 A | | 8/1998 | |
| JP | 2001-526479 A | | 12/2001 | |
| JP | 2007-037006 A | | 2/2007 | |
| JP | 2010-183437 A | | 8/2010 | |
| JP | 2016-513941 A | | 5/2016 | |
| KR | 101673296 B1 | * | 11/2016 | |

* cited by examiner

*Primary Examiner* — Isam A Alsomiri
*Assistant Examiner* — Abdallah Abulaban
(74) *Attorney, Agent, or Firm* — Harness, Dickey & Pierce, P.L.C.

(57) ABSTRACT

An ultrasonic device includes: a vibration film provided with a vibration region that is vibratable by a vibration element; and a damper layer that is provided to cover the vibration region of the vibration film. The damper layer has a thickness dimension of 13 µm or larger and 25 µm or smaller.

9 Claims, 10 Drawing Sheets

ULTRASONIC DEVICE AND ULTRASONIC MEASURING APPARATUS

BACKGROUND

1. Technical Field

The present invention relates to an ultrasonic device and an ultrasonic measuring apparatus.

2. Related Art

In the related art, there has been known an ultrasonic device that outputs an ultrasonic wave to a target object (for example, see JP-A-2010-183437). JP-A-2010-183437 discloses the ultrasonic device (ultrasonic sensor) that includes a diaphragm (film), which is formed by etching a part of a support layer, and a piezoelectric laminate obtained by laminating a lower electrode, a piezoelectric film, and an upper electrode on the diaphragm. In the ultrasonic device, a thin film made of a fluorocarbon is provided to cover a surface of the diaphragm on a side on which the piezoelectric laminate is provided.

In the ultrasonic device, application of a voltage to the lower electrode and the upper electrode of the piezoelectric laminate causes the diaphragm to vibrate, and vibration of the diaphragm directly acts on the air and generates a compressional wave, and thereby an ultrasonic wave is transmitted to the air. Therefore, in the ultrasonic device, there is no need to provide a layer (acoustic matching layer) or the like for achieving matching acoustic impedances separately, and thus simplification of a configuration thereof is achieved.

However, when the diaphragm is solely configured to vibrate, a Q value of the diaphragm is increased, and thus it is difficult to control transmission and reception of the ultrasonic wave. In addition, reverberant vibration (tailing of vibration) occurring after transmission of the ultrasonic wave is prolonged, and a problem arises in that transmission and reception accuracy of the ultrasonic wave decreases.

SUMMARY

An advantage of some aspects of the invention is to provide an ultrasonic device having high transmission and reception accuracy of an ultrasonic wave and an ultrasonic measuring apparatus.

An ultrasonic device according to an application example of the invention includes: a vibration film provided with a vibration region that is vibratable by a vibration element; and a damper layer that is provided to cover the vibration region of the vibration film. The damper layer has a thickness dimension of 13 μm or larger and 25 μm or smaller.

In the application example, the vibration film is provided with the vibration region that is vibratable by the vibration element, and the damper layer is provided at a position, at which the damper layer covers the vibration region, and has the thickness dimension of 13 μm or larger and 25 μm or smaller.

Here, in a case where the damper layer that is provided is provided on the vibration film has the thickness dimension of larger than 25 μm, vibration of the vibration region is inhibited by the damper layer. In this case, when an ultrasonic wave is transmitted, it is not possible to cause the vibration region to vibrate with a sufficient displacement, and thus transmitting sensitivity (acoustic pressure of the ultrasonic wave) of the ultrasonic wave decreases. Even when the ultrasonic wave is received, a displacement of the vibration film due to the received ultrasonic wave is small, and thereby receiving sensitivity also decreases. Further, in a case where the damper layer that is provided on the vibration film has the thickness dimension of smaller than 13 μm, reverberant vibration (tailing of the vibration) occurring when the vibration region vibrates is prolonged, and thus transmission and reception accuracy of the ultrasonic wave decreases.

In this respect, as described above, in a case where the damper layer is provided to have the thickness dimension of 13 μm or larger and 25 μm or smaller, inhibition of the vibration of the vibration region by the damper layer is suppressed, and thereby it is possible to increase transmitting and receiving sensitivity of the ultrasonic wave. In addition, it is also possible to suppress an occurrence of the reverberant vibration, and thus it is possible to improve the transmission and reception accuracy of the ultrasonic wave. In addition, the damper layer is provided on the vibration film, and thereby it is also possible to decrease a Q value of the vibration film, and thus it is also easy to control the transmission and reception of the ultrasonic wave.

In the ultrasonic device according to the application example, it is preferable that the damper layer is formed of a material having Young's modulus of 150 MPa or lower.

In the application example with this configuration, the damper layer has Young's modulus of 150 MPa or lower. In a case where a fluorocarbon film or a layer that is formed of a material having a high Young's modulus, such as polytetrafluoroethylene (PTFE) is formed as the damper layer, the damper layer inhibits the vibration region from vibrating. In this respect, a use of the damper layer configured to have the Young's modulus described above makes it possible to appropriately suppress a problem of inhibition of the vibration of the vibration region.

In the ultrasonic device of the application example, it is preferable that the vibration element is a piezoelectric element that includes a lower electrode provided on a surface of the vibration film, a piezoelectric layer laminated on the lower electrode, and an upper electrode laminated on the piezoelectric layer, and the damper layer is provided on the surface of the vibration film on which the piezoelectric element is provided.

In the application example with this configuration, the vibration element is configured of the piezoelectric element including the lower electrode, the piezoelectric layer, and the upper electrode which are laminated. In the piezoelectric element, a voltage is applied between the lower electrode and the upper electrode, and thereby it is possible to deform the piezoelectric layer, and thus it is possible to cause the vibration region to vibrate due to deformation of the piezoelectric layer such that the ultrasonic wave is transmitted. In addition, when the ultrasonic wave is input to the vibration region of the vibration film, the vibration region is displaced. In this manner, a potential difference corresponding to a displacement amount of the piezoelectric layer provided in the vibration region is produced between the lower electrode and the upper electrode, the potential difference is detected, and thereby it is possible to detect the reception of the ultrasonic wave.

In the application example with this configuration, the damper layer is provided on a side of the vibration film on which the piezoelectric layer is disposed. In other words, the piezoelectric element is configured to be covered with the damper layer, and thus it is possible to protect the piezoelectric element. For example, it is possible to suppress an occurrence of burning-out of the piezoelectric layer due to attachment of a water droplet to the piezoelectric layer.

In the ultrasonic device according to the application example, it is preferable that a direction in which an ultrasonic wave is transmitted when the vibration element causes the vibration region to vibrate is set as a first direction, the damper layer is provided on a surface of the vibration film on an opposite side to the first direction.

In a case where the ultrasonic wave is transmitted into the air by the ultrasonic device according to the application example, and the damper layer is provided on a surface of the vibration film, which is on a side of a transmission direction (first direction) of the ultrasonic wave, the ultrasonic wave is caused to be transmitted into the air via the damper layer. In this case, the ultrasonic wave is attenuated through the damper layer. In this respect, in the application example, since the damper layer is provided on a side of the vibration film, which is opposite to the first direction, it is possible to transmit the ultrasonic wave into the air without attenuation of the ultrasonic wave, and it is also possible to receive the ultrasonic wave in the vibration region from the air without attenuation thereof.

An ultrasonic measuring apparatus according to an application example of the invention includes: the ultrasonic device described above; and a controller that controls the ultrasonic device.

In the application example, as described above, in the ultrasonic device, the damper layer is provided, and thereby it is easy to control the transmission and reception of the ultrasonic wave. In addition, since the vibration of the vibration region is not inhibited by the damper layer, it is possible to increase the transmitting and receiving sensitivity of the ultrasonic wave, it is further possible to suppress the reverberant vibration, and it is possible to perform transmitting and receiving processes of the ultrasonic wave with high accuracy.

Hence, in the ultrasonic measuring apparatus, since the controller is capable of easily controlling the ultrasonic device and is capable of transmitting and receiving the ultrasonic wave with high transmission and reception accuracy, it is possible to measure the ultrasonic wave with high accuracy.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
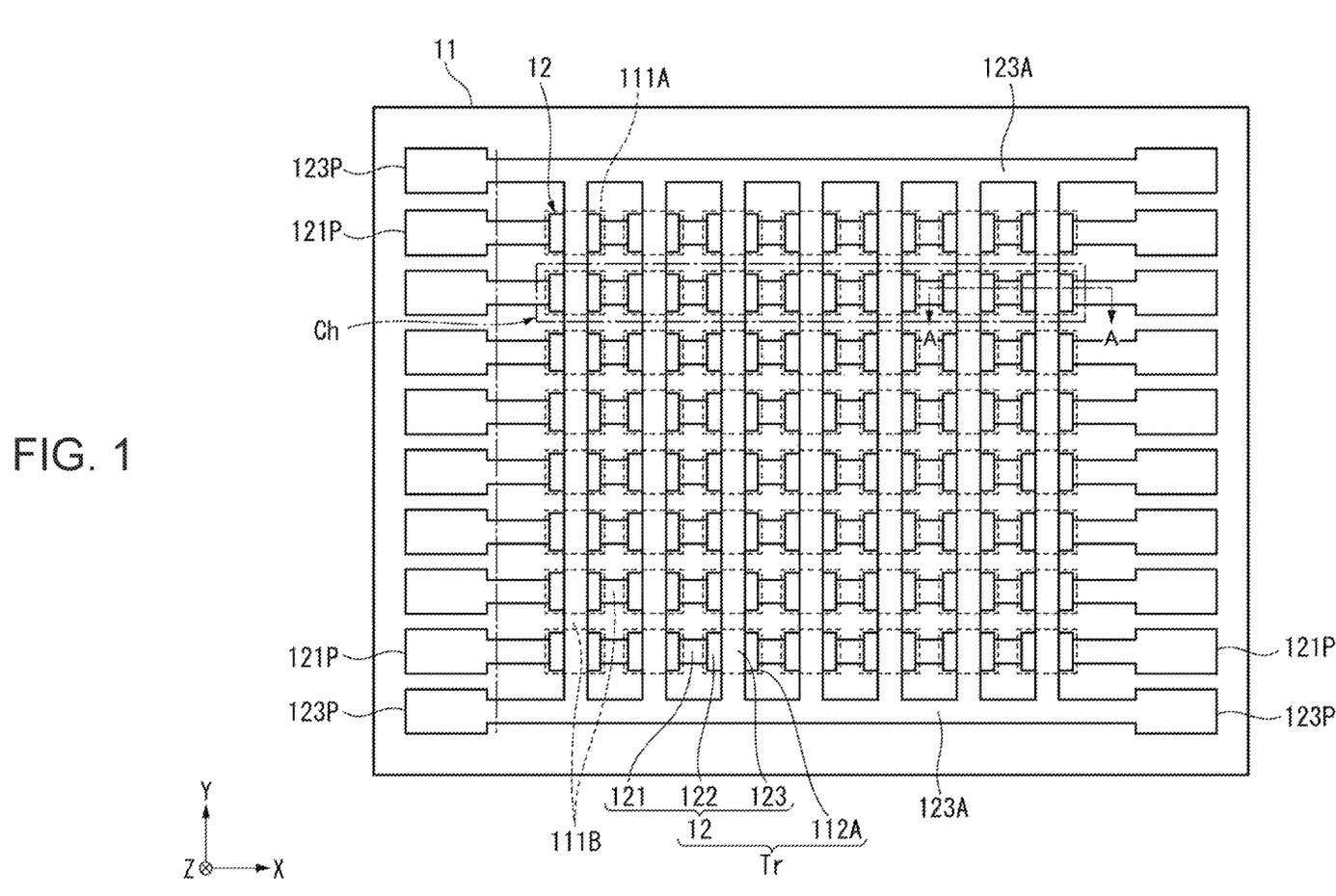
FIG. 1 is a plan view illustrating a schematic configuration of an ultrasonic device of a first embodiment.
Figure 2:
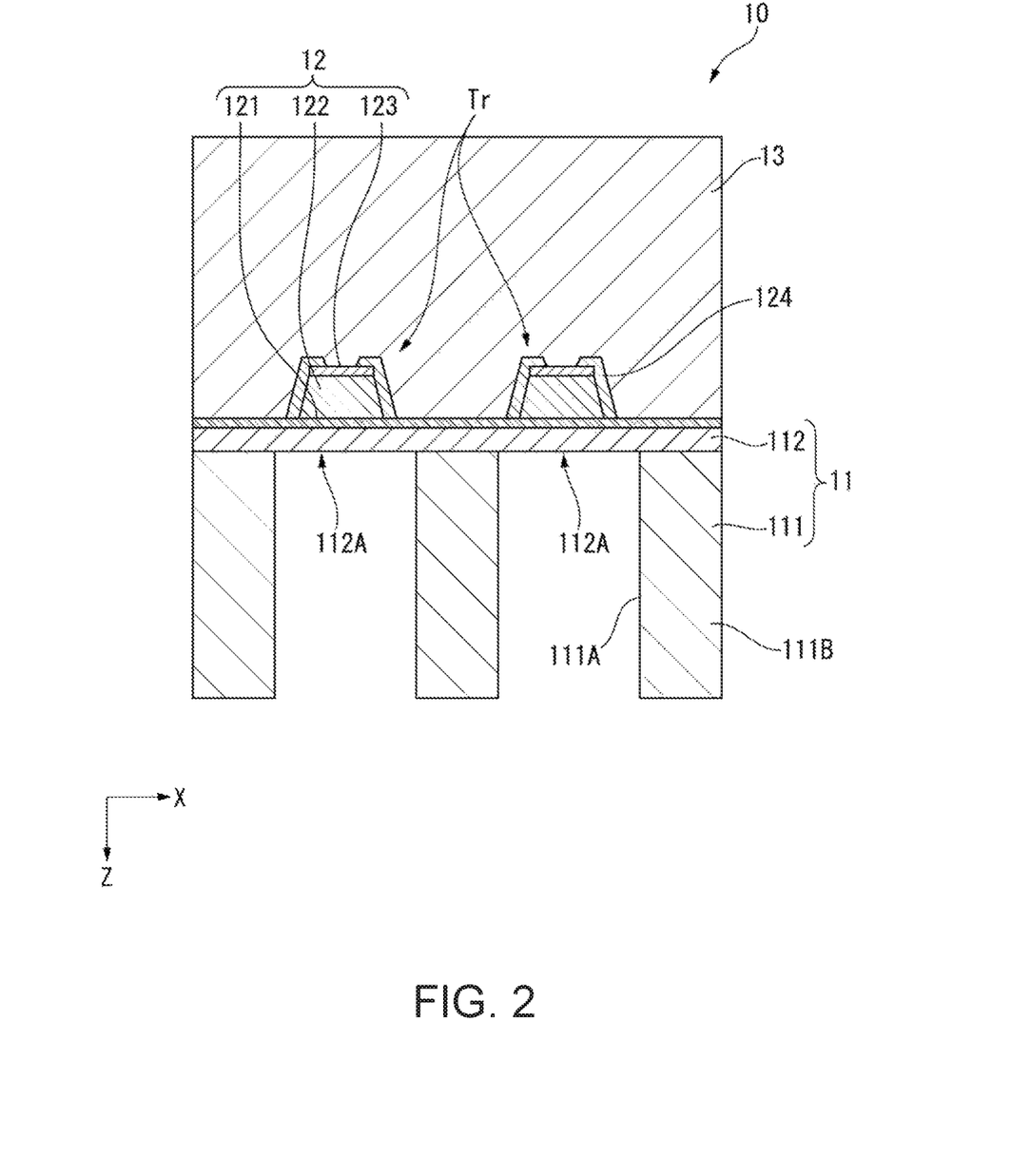
FIG. 2 is a sectional view illustrating a part of the ultrasonic device of the first embodiment.

Hereinafter, an ultrasonic device according to a first embodiment of the invention will be described. FIG. 1 is a plan view illustrating a schematic configuration of an ultrasonic device 10. FIG. 2 is a sectional view of a part of the ultrasonic device 10 cut along line A-A in FIG. 1.

As illustrated in FIGS. 1 and 2, the ultrasonic device 10 is configured to include an element substrate 11, a piezoelectric element 12, and a damper layer 13 (refer to FIG. 2). Here, in the following description, a substrate thickness direction of the element substrate 11 is set as a Z direction, and two axial directions orthogonal to the Z direction is set as an X direction and a Y direction. In addition, the Z direction (direction toward a +Z side) corresponds to a first direction according to the invention and is a direction in which an ultrasonic wave is transmitted.

Configuration of Element Substrate 11

As illustrated in FIG. 2, the element substrate 11 includes a substrate main body 111 and a vibration film 112 that is provided on a −Z side of the substrate main body 111.

For example, the substrate main body 111 is a substrate that supports the vibration film 112 and is formed of a semiconductor substrate made of Si or the like. Here, as illustrated in FIG. 1, the element substrate 11 is provided with a plurality of openings 111A that are disposed to have a two-dimensional array shape in the X direction and the Y direction in plan view in the Z direction.

In the embodiment, the openings 111A are through-holes penetrating the substrate main body 111 in the substrate thickness direction (Z direction), and a vibration film 112 is provided to block a side (−Z side) of one end of the through-hole.

For example, the vibration film 112 is formed of $SiO_2$ or a laminate of $SiO_2$ and $ZrO_2$ and is provided on the −Z side of the substrate main body 111. The vibration film 112 has a sufficiently smaller thickness dimension than a thickness dimension of the substrate main body 111. The vibration film 112 is supported by a wall portion 111B (refer to FIG. 2) of the substrate main body 111, which configures the opening 111A, and blocks the −Z side of the opening 111A. A part (region that blocks the opening 111A) of the vibration film 112, which overlaps the opening 111A in plan view, constitutes a vibration portion 112A. In other words, the opening 111A defines an outer edge of the vibration portion 112A of the vibration film 112. The vibration portion 112A is a vibration region that is able to vibrate by the piezoelectric element 12.

Configuration of Piezoelectric Element 12

The piezoelectric elements 12 are vibration elements according to the invention and are provided on one surface (surface on the −Z side) of the vibration film 112, that is, at positions at which the piezoelectric elements overlap the respective vibration portions 112A, in the embodiment, in the plan view when viewed in the Z direction. As illustrated in FIG. 2, the piezoelectric element 12 is configured by laminating a lower electrode 121, a piezoelectric layer 122, and an upper electrode 123 in this order on the vibration film 112.

Specifically, as illustrated in FIG. 1, the lower electrode 121 is formed to have a linear shape in the X direction. For example, both end portions (±X-side end portion) of the lower electrode 121 are lower electrode terminals 121P that are connected to a circuit substrate which controls the ultrasonic device 10.

In addition, the upper electrode 123 is formed to have a linear shape in the Y direction. ±Y-side end portions of the upper electrode 123 are connected to a common electrode line 123A. The common electrode line 123A connects the plurality of upper electrodes 123 arranged in the X direction to each other, and both end portions (±X-side end portions) of the common electrode line 123A are upper electrode terminals 123P that are connected to the circuit substrate or the like.

For example, the piezoelectric layer 122 is formed of a thin film of a piezoelectric body such as lead zirconate titanate (PZT). As illustrated in FIG. 2, a configuration in which a protective film 124 is provided to cover side surface portions of the piezoelectric layer 122 may be employed.

Here, one ultrasonic transducer Tr is configured to include one vibration portion 112A in the vibration film 112 and a piezoelectric element 12 provided on the vibration portion 112A. Hence, as illustrated in FIG. 1, the ultrasonic device 10 includes a plurality of ultrasonic transducers Tr disposed in the X direction and the Y direction.

In addition, in the ultrasonic device 10, the lower electrode 121 is common in the plurality of ultrasonic transducers Tr disposed in the X direction, and a transmission/reception row Ch of 1 channel (CH) is configured to include the plurality of ultrasonic transducers Tr disposed in the X direction. In addition, a plurality of transmission/reception rows Ch of corresponding 1 CH are disposed to be aligned in the Y direction, and thereby the ultrasonic device 10 having a one-dimensional array structure is configured.

In the ultrasonic transducer Tr configured as described above, a pulsed wave voltage having a predetermined frequency is applied between the lower electrode 121 and the upper electrode 123. In this manner, the piezoelectric layer 122 expands and contracts, and the vibration portion 112A of the vibration film 112, on which the piezoelectric element 12 is provided, vibrates at a frequency corresponding to an opening width or the like of the opening 111A. In this manner, an ultrasonic wave is transmitted from the +Z side (side of the opening 111A) of the vibration portion 112A.

In addition, when the ultrasonic wave is input to the opening 111A, the vibration portion 112A vibrates due to the ultrasonic wave, and a potential difference is produced between upper and lower sides of the piezoelectric layer 122. Hence, the potential difference produced between the lower electrode 121 and the upper electrode 123 is detected, and thereby it is possible to detect (receive) the ultrasonic wave.

Configuration of Damper Layer 13

A damper layer 13 is provided on the −Z side of the vibration film 112.

In the embodiment, the damper layer 13 covers the entire −Z side of the vibration film 112 and the piezoelectric elements 12 (that is, a surface on an opposite side to a side on which the ultrasonic wave is transmitted and received). In a view in the Z direction, a part of the damper layer 13, which overlaps the piezoelectric element 12, is in close contact with a front surface of the piezoelectric element 12, and a part of the damper layer, which does not overlap the piezoelectric element 12, is in close contact with a surface of the vibration film 112 on the −Z side.

The damper layer 13 is formed of a material (for example, silicone or the like) having the Young's modulus of 130 MPa or lower. In addition, the damper layer 13 has a thickness dimension (dimension in the Z direction) of 13 μm or larger and 25 μm or smaller.

Incidentally, in the embodiment, as described above, the ultrasonic wave is transmitted by the vibration of the vibration portion 112A of the vibration film 112. Specifically, the vibration portion 112A is caused to vibrate, and thereby the vibration of the vibration portion 112A is caused to directly act on the air such that a compressional wave is generated. In this manner, the ultrasonic wave is transmitted.

Here, in a configuration in which the vibration film 112 is caused to vibrate such that the ultrasonic wave is transmitted, a Q value of the vibration film 112 very much increases in a case where the damper layer 13 is not provided, and thus it is difficult to control transmission and reception of the ultrasonic wave. In addition, time taken for the vibration to converge (time of an occurrence of reverberant vibration) is also prolonged.

In the embodiment, as described above, the damper layer 13 having the thickness dimension of 13 μm or larger and 25 μm or smaller is provided, and thereby such a problem described above is solved.

Figure 3:
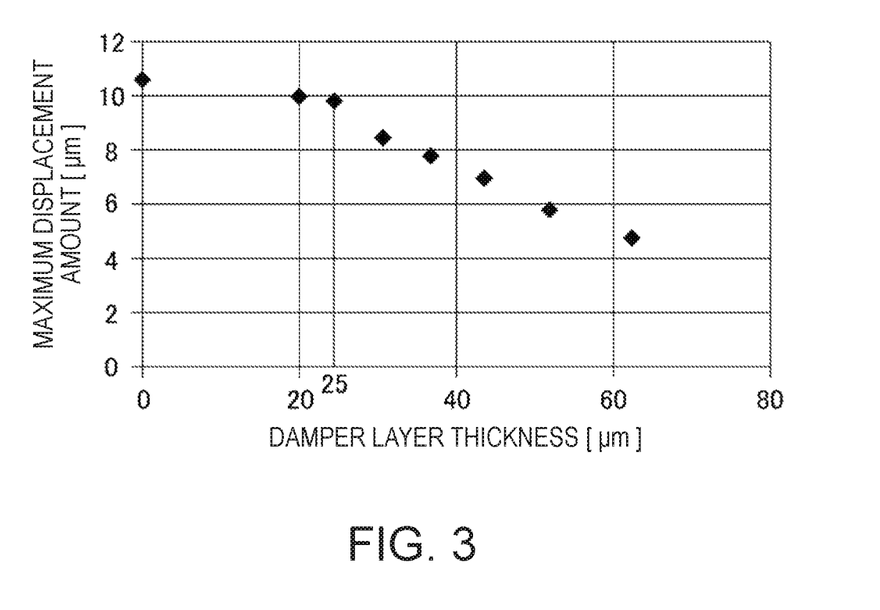
FIG. 3 is a graph illustrating a relationship between a thickness dimension of a damper layer and the maximum displacement amount of a vibration portion in the ultrasonic device.

FIG. 3 is a graph illustrating a relationship between the thickness dimension of the damper layer 13 and the maximum displacement amount of the vibration portion 112A when a predetermined cyclic drive voltage is applied to the piezoelectric element 12 such that the vibration portion 112A is caused to vibrate.

When the damper layer 13 has a large thickness dimension, a vibration amplitude of the vibration portion 112A decreases, and thereby transmitting and receiving sensitivity of the ultrasonic wave decreases. In particular, as illustrated in FIG. 3, when the damper layer 13 has the thickness dimension of larger than 25 μm, the maximum displacement amount decreases significantly. When the maximum displacement amount decreases, the transmitting sensitivity obtained when the voltage is applied to the piezoelectric element 12 decreases. In addition, even when the ultrasonic wave is received, it is difficult to cause the vibration portion 112A to vibrate, and thus the receiving sensitivity decreases.

On the other hand, in a case where the damper layer 13 has the thickness dimension of 25 μm or smaller, the maximum displacement amount of the vibration portion 112A is maintained around 10 μm. In other words, in a case where the damper layer 13 has the thickness dimension of 25 μm or smaller, substantially the same displacement amount as a displacement amount, which is obtained in the case where the damper layer 13 is not provided, is obtained, and thus it is found that the sufficient transmitting and receiving sensitivity of the ultrasonic wave is obtained.

Next, the reverberant vibration occurring when the vibration portion 112A is caused to vibrate will be described.

In the ultrasonic device 10, the ultrasonic waves are transmitted from the ultrasonic transducers Tr, and ultrasonic waves (reflected waves) reflected from a target object is received. In this manner, it is possible to determine a distance from the ultrasonic device 10 to the target object. However, in a case where the vibration portion 112A is caused to vibrate (to have the reverberant vibration) when the ultrasonic wave is transmitted from the ultrasonic transducer Tr, it is difficult to discriminate between a signal in response to the reverberant vibration and a signal in response to the vibration of the vibration portion 112A due to the reception of the reflected wave, when the reflected wave is received, the accuracy during the reception of the ultrasonic wave decreases. In addition, a problem also arises in that a weak ultrasonic wave generated from the reverberant vibration is likely to be transmitted. In particular, in a case where the ultrasonic device 10 is used as a close-range sensor or the like for detecting a target object at a short distance, there is a possibility of receiving the reflected wave during a period during which the reverberant vibration described above remains, and thus it is not preferable that the reverberant vibration occurs for a long period.

Figure 4:
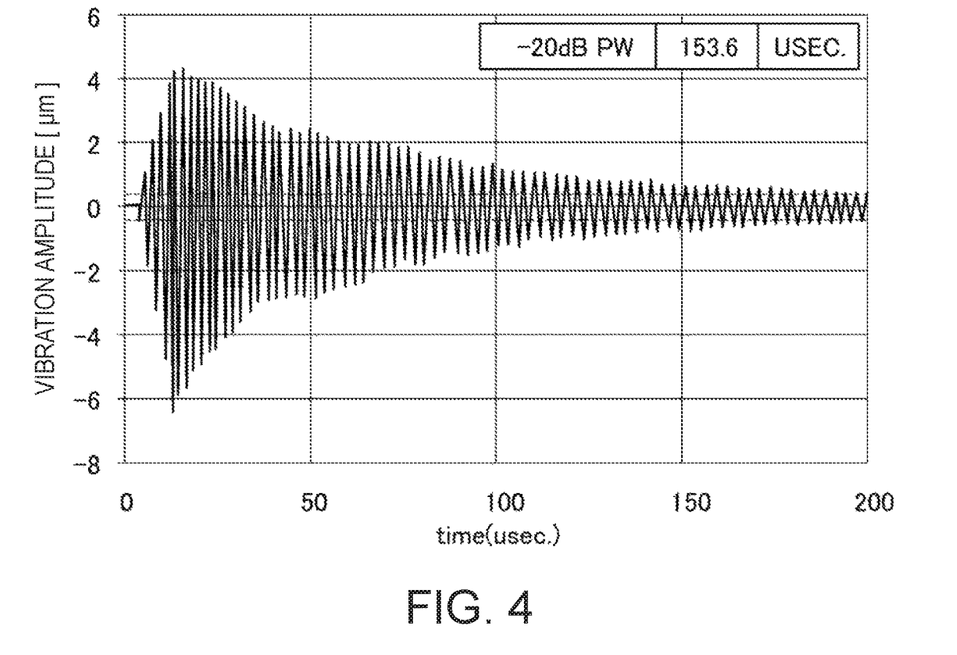
FIG. 4 is a graph illustrating a pulse width obtained by reverberant vibration occurring in a case where the damper layer is not provided.
Figure 5:
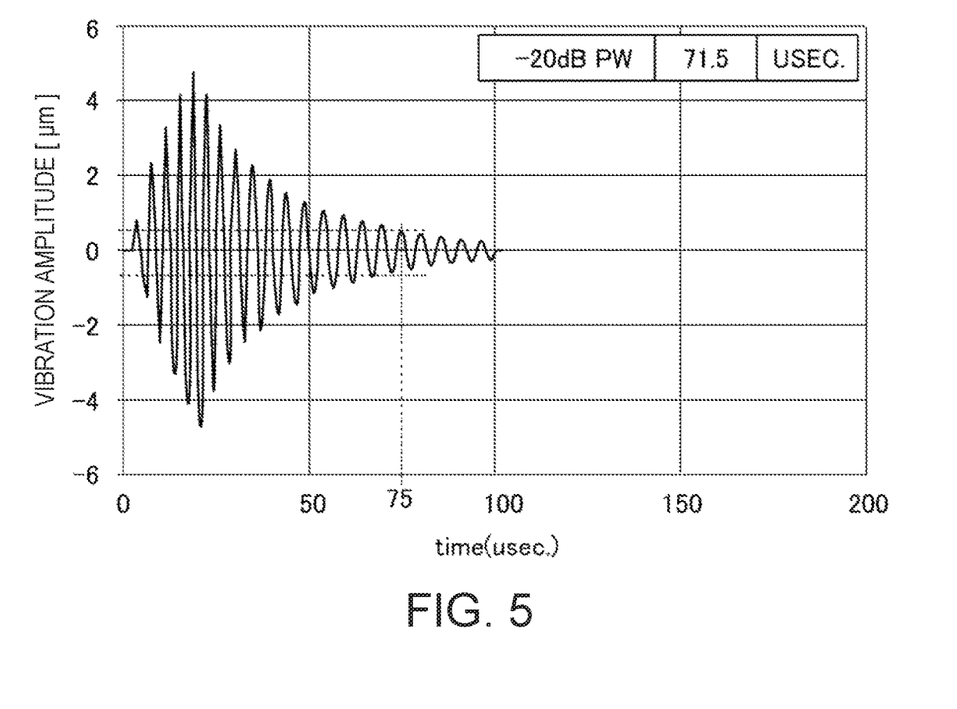
FIG. 5 is a graph illustrating a pulse width obtained by reverberant vibration occurring in a case where the damper layer having a thickness dimension of 20 μm is provided.

Here, after one pulse of the ultrasonic wave is transmitted from the ultrasonic transducer Tr, the time taken for the amplitude to be 1/10 is a pulse width (μsec) by the reverberant vibration. FIG. 4 is a graph illustrating a waveform of the reverberant vibration occurring in a case where the damper layer 13 is not provided. FIG. 5 is a graph illustrating a waveform of the reverberant vibration occurring in a case where the damper layer 13 having the thickness dimension of 20 μm is provided. In FIGS. 4 and 5, dashed lines represent the amplitude that is 1/10 of the maximum amplitude. FIGS. 4 and 5 illustrate a result obtained by measuring a change of a vibration amplitude of the vibration portion 112A after one pulse of ultrasonic wave is transmitted from the ultrasonic transducer Tr.

As illustrated in FIG. 4, a pulse width (time taken for the amplitude to be 1/10), which is obtained in the case where the damper layer 13 is not provided, is about 200 μsec. In this respect, as illustrated in FIG. 5, in the case where the damper layer 13 has the thickness dimension of 20 μm, the pulse width is about 75 μsec, and it is found that the period of the occurrence of the reverberant vibration is ½ or smaller than that obtained in the case where the damper layer 13 is not provided.

Figure 6:
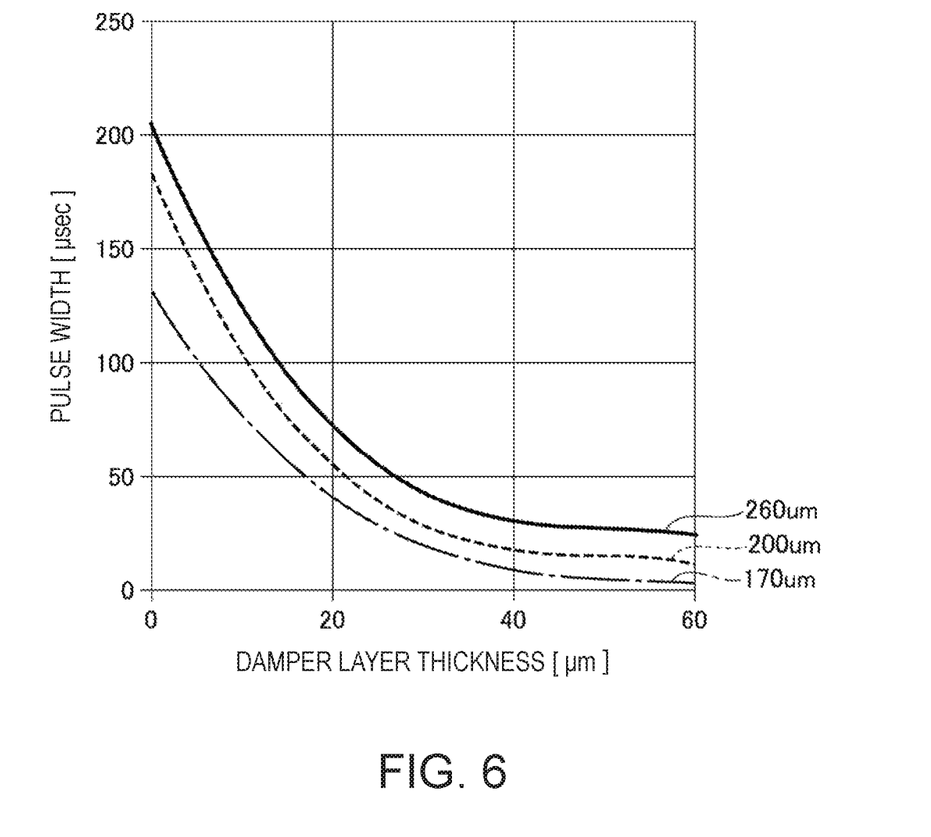
FIG. 6 is a graph illustrating a relationship between the thickness dimension of the damper layer and the pulse width when an opening has a width dimension of 170 μm, 200 μm, and 260 μm.
Figure 7:
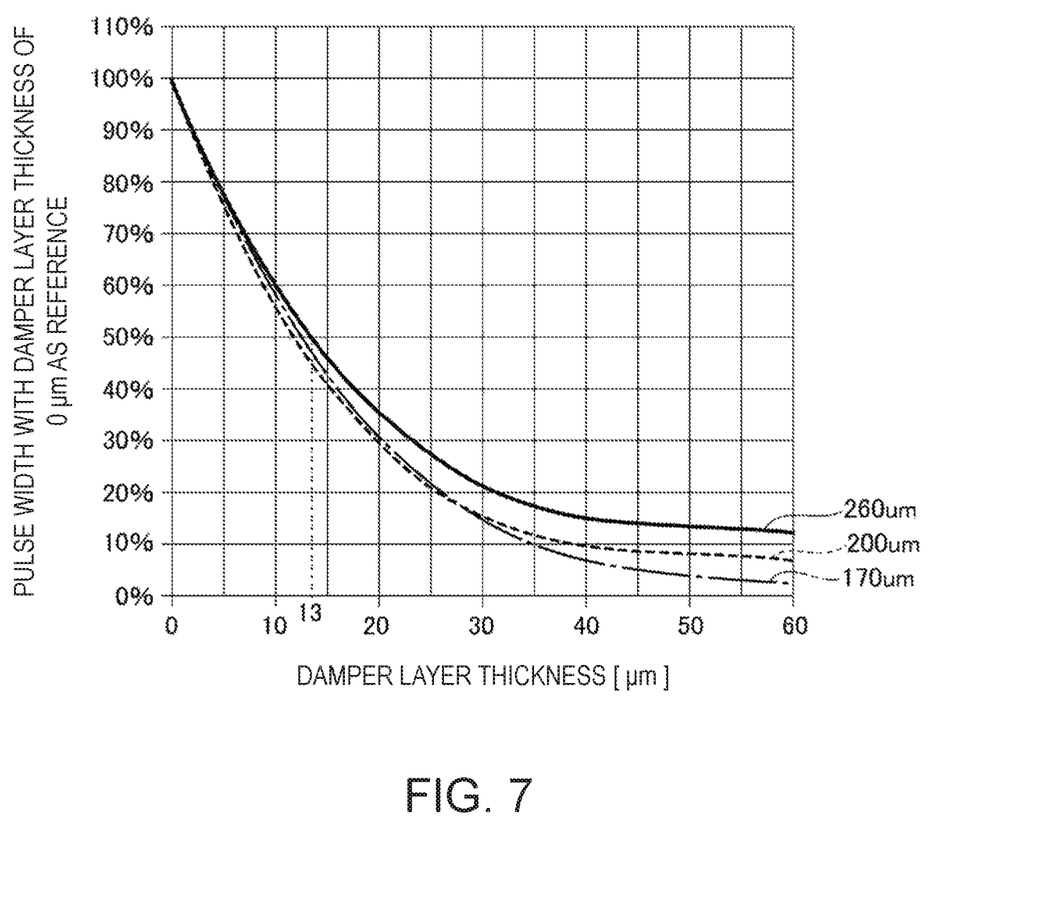
FIG. 7 is a graph illustrating a change in the pulse width when a case of using a damper layer having the thickness dimension of 0 is used as a reference (100%) in FIG. 6.

In addition, FIG. 6 is a graph illustrating a relationship between the thickness dimension of the damper layer 13 and the pulse width when the opening 111A has a width dimension of 170 μm, 200 μm, and 260 μm. FIG. 7 is a graph illustrating a change in the pulse width when a case of using the damper layer 13 having the thickness dimension of 0 is used as a reference (100%) in FIG. 6.

As illustrated in FIGS. 6 and 7, the damper layer has the thickness dimension of 13 μm or larger, and thereby it is possible to decrease the pulse width to ½ or smaller regardless of an opening width (a frequency of the ultrasonic wave) of the opening 111A.

On the other hand, in a case where the damper layer 13 has the thickness dimension of smaller than 13 μm, the pulse width by the reverberant vibration increases, and thus it is not possible to sufficiently maintain the accuracy of transmitting and receiving time of the ultrasonic wave.

In other words, the damper layer 13 having the thickness dimension of 13 μm to 25 μm is provided. In this manner, it is possible to increase the transmitting and receiving sensitivity of the ultrasonic wave, it is also possible to shorten the reverberant vibration, and it is possible to improve transmission and reception accuracy of the ultrasonic wave.

Next, the Young's modulus of the damper layer 13 will be described.

Figure 8:
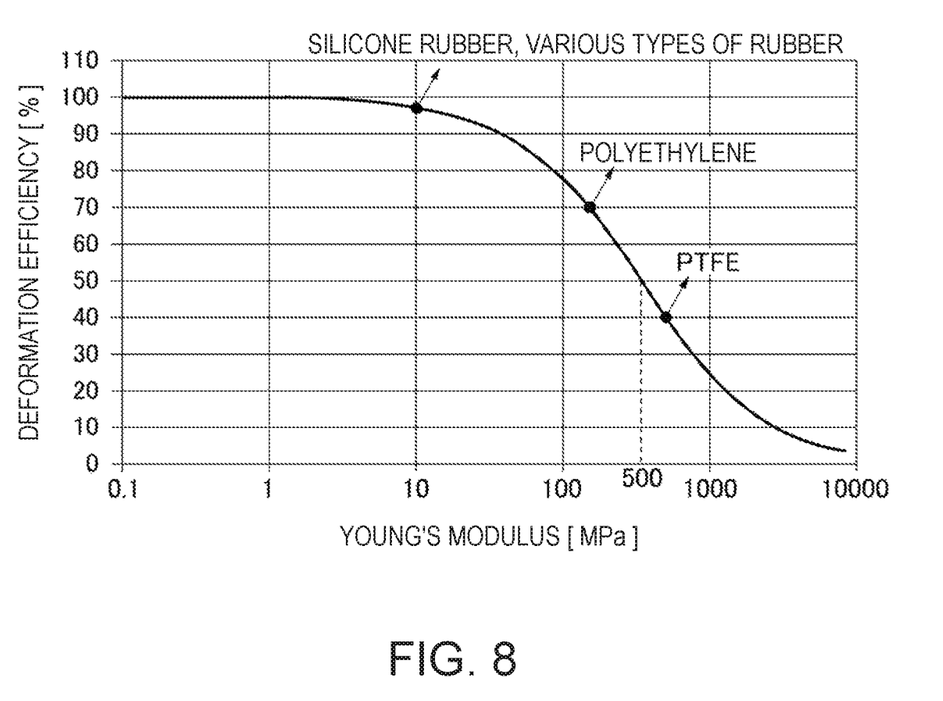
FIG. 8 is a graph illustrating a relationship between Young's modulus of the damper layer and deformation efficiency of a vibration amplitude of the vibration portion.

FIG. 8 is a graph illustrating a relationship between the Young's modulus of the damper layer 13 and deformation efficiency of the vibration amplitude of the vibration portion 112A. In FIG. 8, the deformation efficiency, which is obtained in a case where the damper layer 13 is not provided, is set to 100%.

In a case where the damper layer 13 is made of a material having the Young's modulus of 10 MPa or lower, the vibration amplitude of the vibration portion 112A little changes, compared to the case where the damper layer 13 is not provided, as illustrated in FIG. 8. In other words, it is possible to transmit the ultrasonic wave having a high acoustic pressure during the transmission of the ultrasonic wave. When the ultrasonic wave is received, it is possible to increase the vibration of the vibration portion 112A, and thereby a receiving signal having a high signal level is obtained.

As illustrated in FIG. 8, the vibration efficiency of the vibration portion 112A decreases when the Young's modulus is more increased from 10 MPa, and the vibration efficiency of the vibration portion 112A is lower than 50% when the Young's modulus is higher than 500 MPa.

Regarding the transmitting and receiving sensitivity of the ultrasonic wave, it is preferable to suppress a decrease of the vibration efficiency to 50% or lower. Hence, it is preferable that the Young's modulus of the damper layer 13 is 500 MPa or lower. It is possible to use silicone rubber, various types of rubber materials, polyethylene, or the like as examples of the material of the damper layer 13 and, particularly it is preferable to use silicone rubber or various types of rubber materials which have the Young's modulus of 10 MPa or lower.

Operational Effect of Embodiment

In the ultrasonic device 10 of the embodiment, the damper layer 13 is provided to be in contact with the vibration portion 112A on which the piezoelectric element is provided, the damper layer 13 has the thickness dimension of 13 μm or larger and 25 μm or smaller.

The damper layer 13 is provided. In this manner, it is possible to decrease the Q value of the vibration portion 112A, and it is possible to easily control the transmission and reception of the ultrasonic wave in the ultrasonic device 10. In other words, in a case where the damper layer 13 is not provided on the vibration portion 112A, the ultrasonic transducers Tr have very high responsiveness. Therefore, even in a case where a slight disturbance vibration is input to the ultrasonic device 10, a problem arises in that the vibration portion 112A vibrates and a receiving signal is output. In this case, although the ultrasonic wave is not input, the receiving signal is likely to be output. In this respect, the damper layer 13 is provided. In this manner, it is possible to decrease the Q value of the vibration portion 112A, and it is possible to appropriately control the transmission and reception of the ultrasonic wave.

In addition, in the embodiment, since the damper layer 13 has the thickness dimension of 13 μm or larger, it is possible to suppress the reverberant vibration occurring when the ultrasonic transducer Tr is caused to vibrate, as illustrated in FIGS. 6 and 7. In this manner, unintended transmission of the ultrasonic wave due to the reverberant vibration, reception of the reflected wave during the reverberant vibration, or the like is suppressed, and thus it is possible to improve the transmission and reception accuracy of the ultrasonic wave.

Further, since the damper layer 13 has the thickness dimension of 25 μm, it is possible to suppress a decrease in the maximum displacement amount of the vibration portion 112A, as illustrated in FIG. 3. In this manner, it is possible to transmit the ultrasonic wave having a high output value during the transmission of the ultrasonic wave, it is possible to obtain a receiving signal having a high signal value during the reception of the reflected wave, and thus it is possible to increase the transmitting and receiving sensitivity of the ultrasonic wave.

In other words, in the embodiment, it is possible to increase the transmitting and receiving sensitivity of the ultrasonic wave by the ultrasonic device 10, it is possible to execute the transmitting and receiving process of the ultrasonic wave with high accuracy, and it is also possible to control the transmission and reception of the ultrasonic wave.

In the embodiment, the damper layer 13 has the Young's modulus of 150 MPa or lower. Therefore, a problem of inhibition of the vibration portion 112A from vibrating by the damper layer 13 is suppressed, and thus the deformation efficiency of the vibration portion 112A is maintained to be 50% or higher, as illustrated in FIG. 8. In this manner, it is possible to increase the transmitting and receiving sensitivity of the ultrasonic wave.

In the embodiment, the piezoelectric element 12 is provided on the surface of the vibration portion 112A on the −Z side, and thus the damper layer 13 is formed to cover the vibration portion 112A and the piezoelectric element 12. In such a configuration, a structure in which the piezoelectric element 12 is covered with the damper layer 13 is employed. Thus, it is possible to suppress a problem of burning-out or the like due to the attachment of the water droplet to the piezoelectric element 12, for example, and thus it is possible to appropriately protect the piezoelectric element.

In the embodiment, the ultrasonic device 10 causes the vibration portion 112A to vibrate. In this manner, the ultrasonic wave is transmitted from the vibration portion 112A to the side of the opening 111A, and the ultrasonic wave input from the side of the opening 111A is received. The damper layer 13 is provided on the −Z side of the vibration portion 112A, which is the opposite side to the +Z side that is the transmitting and receiving direction of the ultrasonic wave. Therefore, in the transmitting and receiving processes of the ultrasonic wave, the damper layer is not interposed in a traveling direction of the ultrasonic wave, and thus the ultrasonic wave is not attenuated. Accordingly, it is possible to output the ultrasonic wave having a high output (amplitude) during the transmission of the ultrasonic wave, it is possible to have the large displacement amount of the vibration portion 112A by the reflected wave, and it is possible to obtain a receiving signal having a high signal value during the reception of the ultrasonic wave.

Second Embodiment

Next, a second embodiment will be described. In the second embodiment, a distance sensor is described as an example of an ultrasonic measuring apparatus including the ultrasonic device 10 described in the first embodiment.

Figure 9:
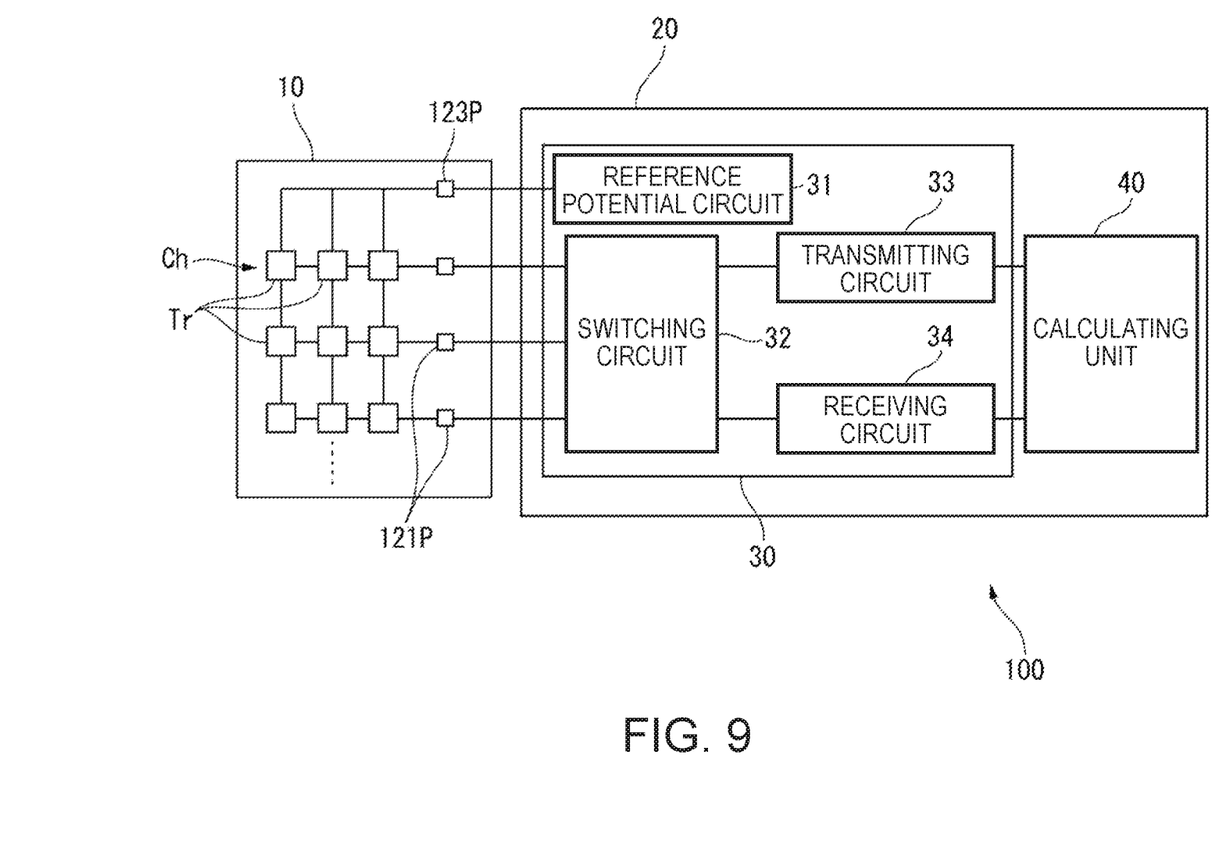
FIG. 9 is a diagram illustrating a schematic configuration of a distance sensor according to a second embodiment.

FIG. 9 is a diagram illustrating a schematic configuration of the distance sensor 100 according to the second embodiment.

As illustrated in FIG. 9, a distance sensor 100 of the embodiment is configured to include the ultrasonic device 10 and a controller 20 that controls the ultrasonic device 10. The controller 20 is configured to include a drive circuit 30, which drives the ultrasonic device 10, and a calculating unit 40. In addition, the controller 20 may include a storage unit in which various types of data, various types of programs, or the like for controlling the distance sensor 100 are stored.

The drive circuit 30 is a driver circuit for controlling the drive of the ultrasonic device 10 and includes a reference potential circuit 31, a switching circuit 32, a transmitting circuit 33, a receiving circuit 34, and the like, as illustrated in FIG. 9, for example.

The reference potential circuit 31 is connected to the upper electrode terminal 123P and applies a reference potential (for example, −3 V or the like) to the upper electrode terminal 123P.

The switching circuit 32 is connected to the lower electrode terminals 121P, the transmitting circuit 33, and the receiving circuit 34. The switching circuit 32 is configured of a switching circuit and switches a connection between a transmitting connection by which each of the lower electrode terminals 121P is connected to the transmitting circuit 33 and a receiving connection by which each of the lower electrode terminals 121P is connected to the receiving circuit 34.

When the transmitting circuit 33 is connected to the switching circuit 32 and the calculating unit 40, and the switching circuit 32 switches the connection to the transmitting connection, a drive signal having a pulse waveform is output to the ultrasonic transducers Tr based on the control of the calculating unit 40, and an ultrasonic wave is transmitted from the ultrasonic device 10.

When the receiving circuit 34 is connected to the switching circuit 32 and the calculating unit 40, and the switching circuit 32 switches the connection to the receiving connection, receiving signals from the lower electrodes 121 are input. For example, the receiving circuit 34 is configured to have a linear noise amplifier, an A/D converter, or the like, for example, converts the input receiving signal into a digital signal, removes a noise component, executes various types of signal processing such as amplification to a predetermined signal level, and then outputs the processed receiving signal to the calculating unit 40.

The calculating unit 40 is configured of a central processing unit (CPU) or the like, for example, controls the ultrasonic device 10 via the drive circuit 30, and executes the transmitting and receiving processes of the ultrasonic wave by the ultrasonic device 10.

In other words, the calculating unit 40 causes the switching circuit 32 to switch the connection to the transmitting connection, causes the transmitting circuit 33 to output a drive signal to the ultrasonic transducers Tr of the ultrasonic device 10, and transmits the ultrasonic wave. In addition, immediately after the calculating unit 40 transmits the ultrasonic wave, the switching circuit 32 switches the connection to the receiving connection. In this manner, when the ultrasonic device 10 receives the reflected wave, the receiving signal is input to the calculating unit 40 via the receiving circuit 34. Then, the calculating unit 40 calculates a distance from the ultrasonic device 10 to the target object by a time of flight (ToF) method using both of time from a transmission timing when the ultrasonic wave is transmitted from the ultrasonic device 10 to a timing when the receiving signal is received and a sound speed in the air.

The distance sensor 100 of the embodiment described above includes the ultrasonic device 10 described in the first embodiment. As described above, in the ultrasonic device 10, since the damper layer 13 having the thickness dimension of 13 µm to 25 µm is provided on vibration film 112, it is possible to transmit and receive the ultrasonic wave with high accuracy, which is obtained by suppressing the reverberant vibration, and it is also easy to control the transmission and reception of the ultrasonic wave while the high transmitting and receiving sensitivity of the ultrasonic wave by the ultrasonic device 10 is maintained.

Hence, the controller 20 is capable of easily controlling the transmitting and receiving processes of the ultrasonic wave of the ultrasonic device 10 and is capable of calculating the distance from the ultrasonic device 10 to the target object with high accuracy, based on the highly accurate result of transmission and reception of the ultrasonic wave, which is obtained by the ultrasonic device 10.

Modification Example

The invention is not limited to the embodiments described above and modification examples, and the invention also includes a configuration obtained through modification, improvement, an appropriate combination of the embodiments or the like in a range in which it is possible to achieve the object of the invention.

For example, in the first embodiment, the ultrasonic device 10 has a configuration in which the ultrasonic wave is transmitted from the side of the opening 111A of the element substrate 11, the ultrasonic wave that is input to the opening 111A is received, and the damper layer 13 is provided on the surface of the vibration film 112 on the opposite side to the substrate main body 111; however, the configuration is not limited thereto.

Figure 10:
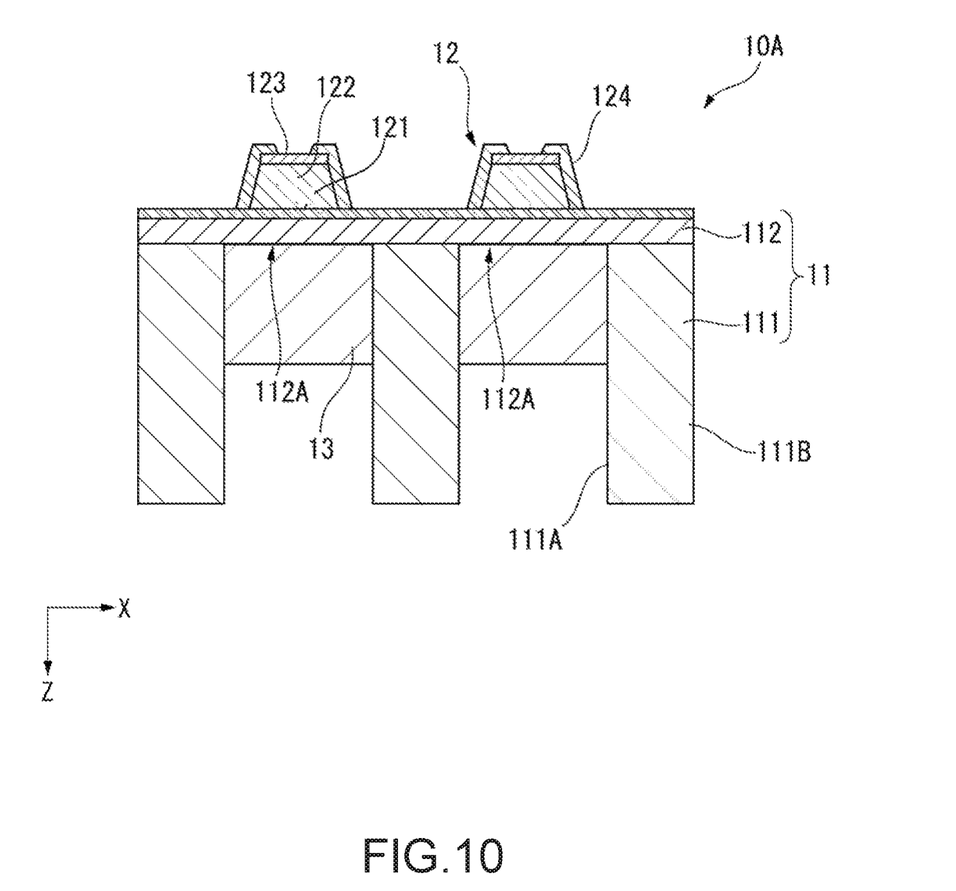
FIG. 10 is a sectional view illustrating a schematic configuration of an ultrasonic device according to a modification example of the first embodiment.
Figure 11:
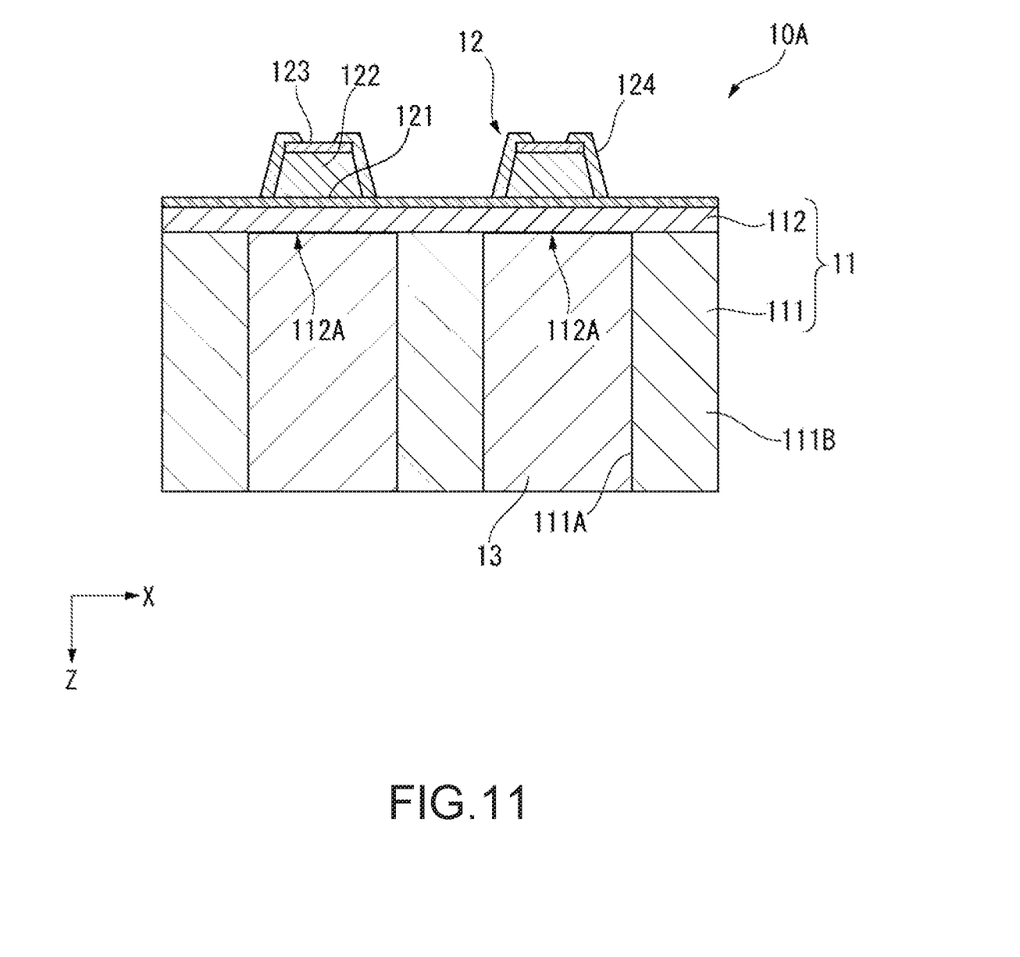
FIG. 11 is a sectional view illustrating a schematic configuration of an ultrasonic device according to another modification example of the first embodiment.

FIGS. 10 and 11 are sectional views illustrating another example of the ultrasonic device.

For example, in an ultrasonic device 10A illustrated in FIG. 10, the surface (surface on which the piezoelectric element 12 is provided) of the element substrate 11 on the opposite side to the opening 111A is a transmitting and receiving surface of the ultrasonic wave. In other words, the ultrasonic device 10A transmits the ultrasonic wave from the vibration film 112 to the −Z side (opposite side to the substrate main body 111), and the ultrasonic wave input from the −Z side is received to the vibration portion 112A. As illustrated in FIG. 10, in the ultrasonic device 10A configured as described above, it is preferable that the damper layer 13 is provided in the opening 111A.

In addition, In this case, as illustrated in FIG. 11, the substrate main body 111 may be configured to have the same thickness dimension as the thickness dimension of the damper layer 13.

In the first embodiment, an example in which the damper layer 13 is formed of a material having the Young's modulus of 150 MPa or lower; however, it is more preferable that the Young's modulus is 10 MPa or lower and, specifically, it is more preferable that the damper layer is formed of silicone or various types of rubber materials.

In the first embodiment, the piezoelectric element is exemplified as the vibration element that vibrates the vibration portion 112A of the vibration film 112; however, the vibration element is not limited to the piezoelectric element.

For example, a configuration in which a substrate that is opposite to a vibration region (vibration portion) of the vibration film via an air gap is provided, and electrodes are each provided on the vibration portion and the substrate may be employed. In the configuration, a cyclic drive voltage is applied between the electrode provided on the vibration portion and the electrode provided on the substrate. In this manner, the vibration portion is attracted to a side of the substrate due to an electrostatic attractive force, and thereby the vibration portion vibrates and the ultrasonic wave is transmitted. In addition, when the ultrasonic wave is received, the vibration portion is caused to vibrate, and thereby capacitance between the electrodes fluctuates. In other words, fluctuation of the capacitance is detected, and thereby reception of the ultrasonic wave is detected.

In addition, in the configuration, the ultrasonic wave is output to the side of the vibration portion which is opposite to the substrate. Hence, in the configuration, the damper layer that is in contact with the vibration portion is provided in a space (air gap) between the vibration portion and the substrate. In this manner, similar to the embodiment, while the high transmitting and receiving sensitivity of the ultrasonic wave is maintained, it is possible to suppress the reverberant vibration, and it is also possible to easily control the transmission and reception of the ultrasonic wave.

In the first embodiment, the ultrasonic device 10 that transmits the ultrasonic wave into the air and receives the ultrasonic wave propagated from the air is exemplified, and the configuration in which the damper layer 13 is provided on the surface of the vibration film 112 on the opposite side to the transmitting direction of the ultrasonic wave is employed.

In this respect, for example, in a case where the ultrasonic wave is transmitted into water or the like, a configuration in which the damper layer 13 configured of silicone rubber or the like is provided on the vibration film 112 in the transmitting direction of the ultrasonic wave may be employed. In other words, as long as the damper layer 13 has an acoustic impedance that is substantially equal to that of a medium through which the ultrasonic wave is propagated, the damper layer may be provided in the transmitting direction of the ultrasonic wave.

In the second embodiments described above, the distance sensor 100 is exemplified as an example of the ultrasonic measuring apparatus; however, the second embodiment is not limited thereto. For example, the invention can be applied to an ultrasonic measuring apparatus or the like that measures an internal tomogram of a structure, depending on a transmission and reception result of the ultrasonic wave.

In addition, the specific structures used when the invention is implemented may be configured by appropriately combining the embodiments and the modification examples or may be appropriately modified to obtain another structure in a range in which it is possible to achieve the object of the invention.

The entire disclosure of Japanese Patent Application No. 2017-207577 filed Oct. 26, 2017 is expressly incorporated herein by reference.

What is claimed is:

1. An ultrasonic device comprising:
   a vibration film provided with a vibration region that is vibratable by a vibration element;
   the vibration element is a piezoelectric element that includes a lower electrode provided on a surface of the vibration film, a piezoelectric layer laminated on the lower electrode, an upper electrode laminated on the piezoelectric layer, and a protective film that directly contacts each of the lower electrode, the piezoelectric layer, and the upper electrode of the piezoelectric element, the protective film being in direct contact with opposing lateral edges of each of the piezoelectric layer and the upper electrode; and
   a damper layer that is provided to cover the surface of the vibration film, the damper layer being provided on the same side of the vibration film as the piezoelectric element, and the damper layer covering the piezoelectric element, wherein the damper layer has a thickness dimension of 13 μm or larger and 25 μm or smaller, and wherein the damper layer contacts the lower electrode, upper electrode, and the protective film of the piezoelectric element.

2. The ultrasonic device according to claim 1, wherein the damper layer is formed of a material having Young's modulus of 150 MPa or lower.

3. The ultrasonic device according to claim 1, wherein a direction in which an ultrasonic wave is transmitted when the vibration element causes the vibration region to vibrate is set as a first direction, and wherein the damper layer is provided on a surface of the vibration film on an opposite side to the first direction.

4. An ultrasonic measuring apparatus comprising:

the ultrasonic device according to claim 1; and a controller that controls the ultrasonic device.

5. An ultrasonic measuring apparatus comprising:

the ultrasonic device according to claim 2; and a controller that controls the ultrasonic device.

6. An ultrasonic measuring apparatus comprising:

the ultrasonic device according to claim 3; and a controller that controls the ultrasonic device.

7. The ultrasonic device according to claim 1, wherein the protective film directly contacts side surface portions of the piezoelectric layer, and the protective film is located between the vibration element and the damper layer.

8. The ultrasonic device according to claim 1, further comprising a substrate that supports the vibration film and has an opening, wherein the vibration region of the vibration film overlaps the opening, and a width dimension of the opening is equal to or less than 260 micrometers.

9. The ultrasonic device according to claim 1, wherein a pulse width by a reverberant vibration of the vibration film is less than 200 microseconds.

* * * * *